United States Patent
Sutton et al.

(10) Patent No.: US 6,487,792 B2
(45) Date of Patent: Dec. 3, 2002

(54) METHOD AND APPARATUS FOR AGITATION OF WORKPIECE IN HIGH PRESSURE ENVIRONMENT

(75) Inventors: Thomas R. Sutton, San Jose, CA (US); Robert Koch, Palo Alto, CA (US)

(73) Assignee: Tokyo Electron Limited, Tokyo (JP)

( * ) Notice: Subject to any disclaimer, the term of this patent is extended or adjusted under 35 U.S.C. 154(b) by 28 days.

(21) Appl. No.: 09/850,888

(22) Filed: May 7, 2001

(65) Prior Publication Data

US 2001/0037586 A1 Nov. 8, 2001

Related U.S. Application Data

(60) Provisional application No. 60/202,835, filed on May 8, 2000.

(51) Int. Cl.⁷ .................................................. F26B 5/08
(52) U.S. Cl. .............................. 34/328; 34/58; 34/665; 134/34; 438/116
(58) Field of Search ...................... 34/312, 318, 328, 34/500, 58, 664, 665, 184; 134/32, 33, 34; 438/116, 125, 126, 127; 414/172, 744.5, 744.6, 744.4, 935, 941

(56) References Cited

U.S. PATENT DOCUMENTS

| | | | |
|---|---|---|---|
| 5,288,333 A | 2/1994 | Tanaka et al. ............... 134/31 |
| 5,370,741 A | 12/1994 | Bergman ....................... 134/3 |
| 5,500,081 A | 3/1996 | Bergman ................... 156/646.1 |
| 5,934,856 A | 8/1999 | Asakawa et al. ............ 414/217 |
| 6,005,226 A | 12/1999 | Aschner et al. ............. 219/390 |
| 6,077,321 A | 6/2000 | Adachi et al. ............. 29/25.01 |
| 6,145,519 A | * 11/2000 | Konishi et al. ............ 134/95.2 |
| 6,149,828 A | 11/2000 | Vaartstra ...................... 216/57 |
| 6,251,250 B1 | * 6/2001 | Keigler ........................ 205/89 |

FOREIGN PATENT DOCUMENTS

| DE | 36 08 783 A1 | 9/1987 |
| JP | 10-144757 A | 5/1998 |
| WO | WO 91/12629 A | 8/1991 |
| WO | WO 99/18603 A | 4/1999 |
| WO | WO 00/36635 | 6/2000 |

* cited by examiner

Primary Examiner—Pamela Wilson
(74) Attorney, Agent, or Firm—Haverstock & Owens LLP

(57) ABSTRACT

An apparatus for agitating a workpiece in a high pressure environment comprises a workpiece holder, a bearing, a pressure chamber housing, and a nozzle. The workpiece holder couples to the pressure chamber housing via the bearing. The nozzle couples to the pressure chamber housing. The workpiece holder comprises protrusions and a region for holding the workpiece. In operation a fluid exits the nozzle and impinges the protrusions of the workpiece holder causing the workpiece holder to rotate, which agitates the workpiece.

12 Claims, 4 Drawing Sheets

METHOD AND APPARATUS FOR AGITATION OF WORKPIECE IN HIGH PRESSURE ENVIRONMENT

RELATED APPLICATIONS

This application claims priority from U.S. Provisional Patent Application No. 60/202,835, filed on May 8, 2000, which is incorporated by reference.

FIELD OF THE INVENTION

This invention relates to the field of high pressure processing. More particularly, this invention relates of high pressure processing where a workpiece is agitated.

BACKGROUND OF THE INVENTION

Fluid processing of a workpiece often requires agitation of the workpiece. In high pressure processing, a prior art method of agitation of the workpiece includes placing the workpiece on a holder connected by a drive shaft through a pressure chamber housing to a drive mechanism. The drive mechanism rotates the drive shaft and consequently rotates the holder to provide agitation of the workpiece. A second prior art method of agitation of the workpiece uses a magnetically coupled motor, where a magnetic field drives a rotor within the pressure chamber housing.

Providing either the drive shaft through the pressure chamber housing or a magnetically coupled motor complicates design and fabrication of a high pressure processing system. Further, providing either the drive shaft through the pressure chamber housing or the magnetically coupled motor is expensive.

What is needed is a method of agitating a workpiece in a pressure chamber that does not use a drive shaft through a pressure chamber housing and that does not use a magnetically coupled motor.

What is needed is a method of agitating a workpiece in a pressure chamber that is more economical than using a drive shaft through a pressure chamber housing and that is more economical than using a magnetically coupled motor.

SUMMARY OF THE INVENTION

An apparatus for agitating a workpiece in a high pressure environment of the present invention comprises a workpiece holder, a bearing, a pressure chamber housing, and a nozzle. The workpiece holder couples to the pressure chamber housing via the bearing. The nozzle couples to the pressure chamber housing. The workpiece holder comprises protrusions and a region for holding the workpiece. In operation a fluid exits the nozzle and impinges the protrusions of the workpiece holder causing the workpiece holder to rotate, which agitates the workpiece.

DETAILED DESCRIPTION OF THE PREFERRED EMBODIMENT

Figure 1:
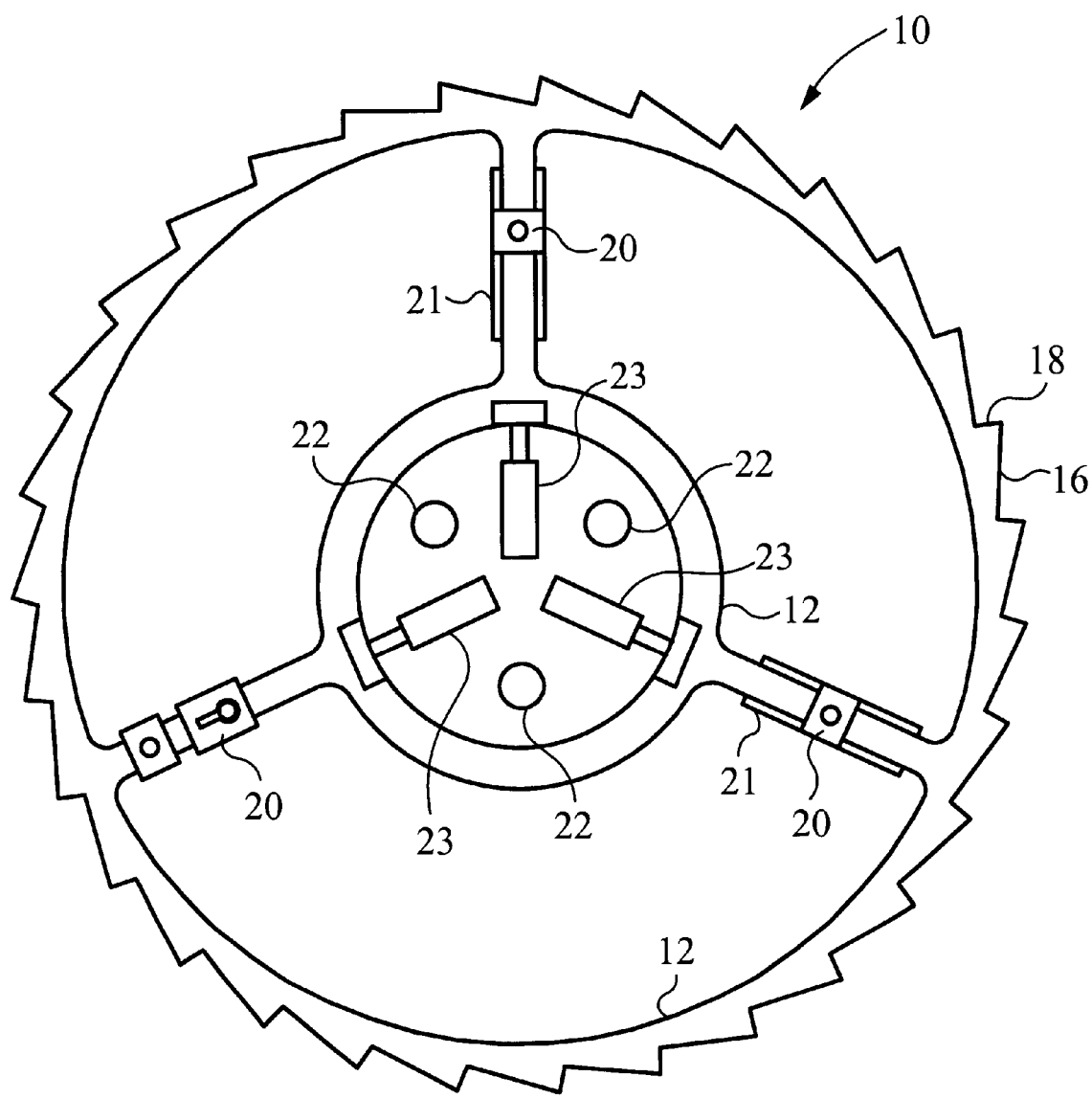
FIG. 1 illustrates the preferred agitation device of the present invention.

The preferred agitation device of the present invention is illustrated in FIG. 1. The preferred agitation device 10 comprises a rotatable workpiece holder 12 and a bearing (not shown). The workpiece holder 12 comprises a jagged edge 16 of protrusions 18. The bearing couples the workpiece holder 12 to a pressure chamber housing (not shown). In operation, an injection nozzle impels a fluid against the protrusions of the jagged edge 16 causing the workpiece holder 12 to rotate on the bearing.

Preferably, the workpiece holder 12 is configured to hold a semiconductor substrate. Preferably, the semiconductor substrate is a semiconductor wafer. Alternatively, the semiconductor substrate is a different semiconductor substrate such as a puck. Preferably, the workpiece holder 12 comprises holding clamps 20, which hold the semiconductor substrate to the workpiece holder 12. Preferably, the preferred agitation device 10 operates in a high pressure environment. More preferably, the preferred agitation device 10 operates in a supercritical environment.

Preferably, the preferred agitation device 10 includes one or more sweeper blocks 21, which agitate fluid below the preferred agitation device 10. Alternatively, the preferred agitation device 10 does not include the sweeper blocks 21. The preferred agitation device 10 includes retractable arms 23 so that a small workpiece can be clamped at a center of the preferred agitation device 10. Alternatively, the preferred agitation device 10 does not include the retractable arms 23.

Preferably, the bearing allows the workpiece holder 14 to rotate relative to a plate located proximate to an inner diameter of the bearing. The plate is rotatably coupled to the workpiece holder 12 via the bearing and comprises first screw holes. The plate is preferably coupled to the pressure chamber housing by screws through the first screw holes. Preferably, the screws are installed through second screw holes 22 in the workpiece holder 12. Preferably, the bearing is a chemically neutral bearing.

Since the preferred agitation device 10 is driven by the injection nozzle, the preferred agitation device 10 provides agitation of a workpiece without using a rotatable shaft through the pressure chamber housing and without using a magnetically coupled motor. This simplifies a high pressure processing system that includes the preferred agitation device and makes the high pressure processing system more economical.

Figure 2:
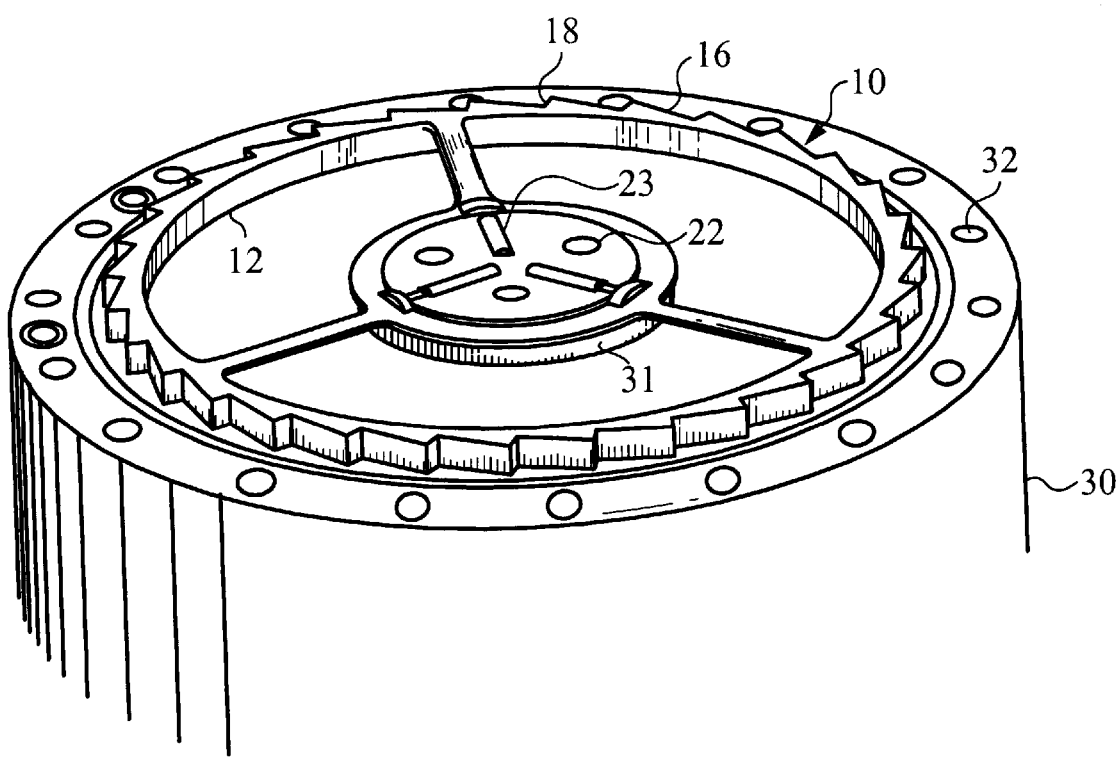
FIG. 2 illustrates the preferred agitation device and a lower portion of a pressure chamber housing of the present invention.

The preferred agitation device 10 and a lower portion of the pressure chamber housing are illustrated in FIG. 2. The preferred agitation device comprises the rotateable workpiece holder 12 and the bearing 31. The preferred agitation device 10 couples to the lower portion 30 of the pressure chamber housing. Bolt holes 32 in the lower portion 30 of the pressure chamber housing provide for coupling of an upper portion of the pressure chamber housing to the lower portion 30 by bolts. When bolted together, the lower portion 30 of the pressure chamber housing and the upper portion of the pressure chamber housing form a pressure chamber. Alternatively, the upper portion of the pressure chamber housing couples to the lower portion 30 via a clamp. Further alternatively, the upper portion couples to the lower portion via a hydraulic actuator.

Figure 3:
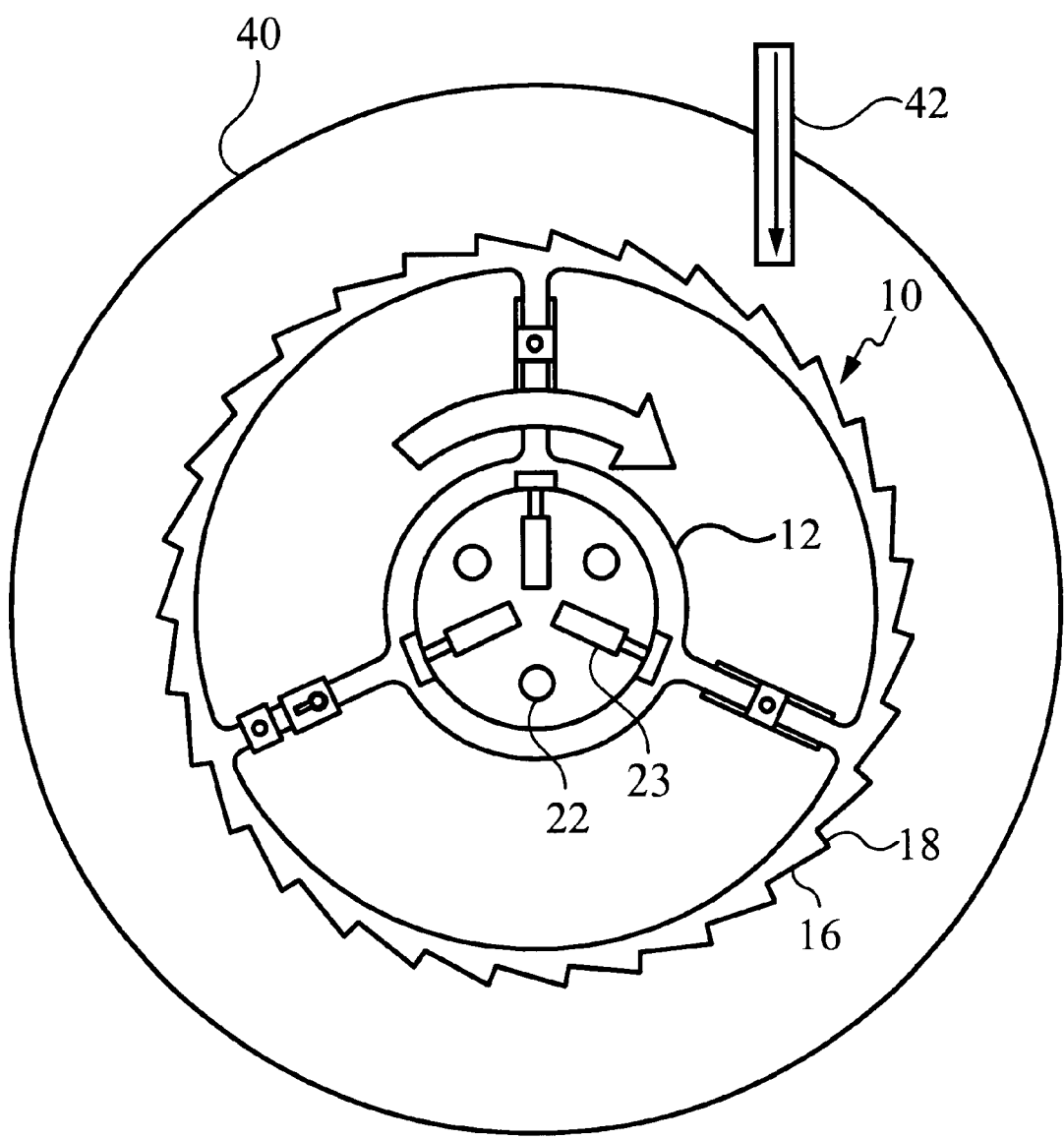
FIG. 3 illustrates the preferred agitation device and the pressure chamber housing of the present invention.

The preferred agitation device 10 and the pressure chamber are further illustrated in FIG. 3. The pressure chamber 40 includes the injection nozzle 42. In operation, the injection nozzle impels the fluid against the protrusions 18 of the workpiece holder 12 causing the workpiece holder 12 to rotate. Alternatively, one or more additional injection nozzles are provided to impel the fluid against the protrusions 18.

Figure 4:
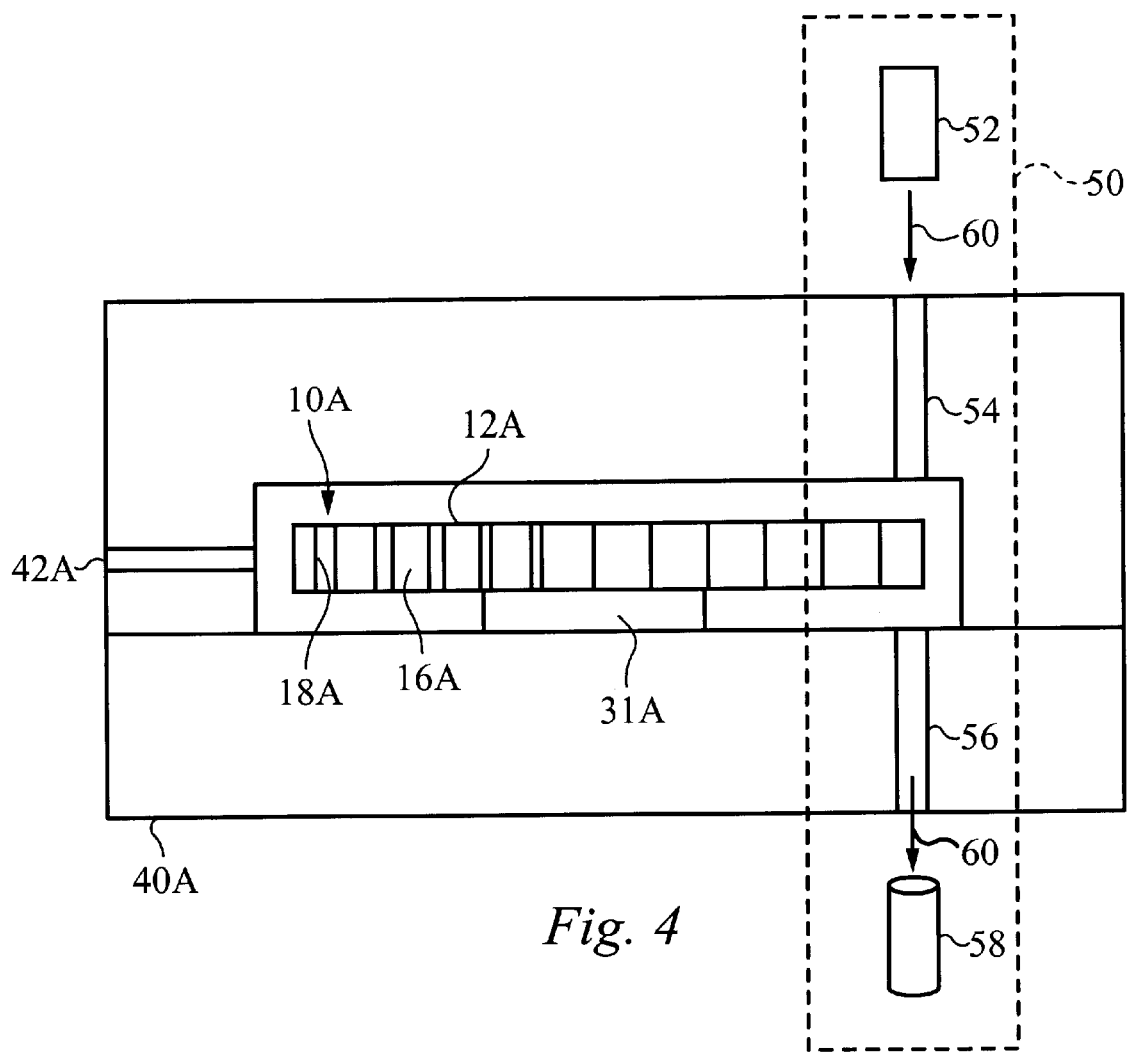
FIG. 4 illustrates an alternative agitation device, an alternative pressure chamber, and a light sensing arrangement of the present invention.

An alternative agitation device, an alternative pressure chamber, and a rotation speed sensing arrangement of the present invention are illustrated in FIG. 4. The alternative agitation device 10A comprises an alternative workpiece holder 12A, an alternative bearing 31A, and alternative protrusions 18A of an alternative jagged edge 16A. The alternative bearing 31A couples the alternative workpiece holder 12A to the alternative pressure chamber 40A. The alternative bearing 31A is selected from a group comprising a roller bearing, a ball bearing, and a journal bearing. In operation, an alternative injection nozzle 42A impels the fluid against the alternative protrusions 18A causing the alternative workpiece holder 12A to rotate. The rotation of the alternative workpiece holder 12A causes agitation of the workpiece.

The rotation speed sensing arrangement 50 comprises a light source 52, first and second sight glasses, 54 and 56, and a light sensor 58. The light source 52 emits light 60 which couples to the light source 58 via the first and second sight glasses, 54 and 56. As the first alternative workpiece holder 12A rotates, the alternative jagged edge 16A interrupts the light 60 coupling to the light sensor 58 as each of the alternative protrusions 18 passes through the light 60. Thus, the light sensor 58 senses each time one of the alternative protrusions 18A passes through the light 60 as an interruption of the light 60. Electronics coupled to the light sensor 58 count the interruptions of the light 60 to provide a measurement of rotation speed of the first alternative workpiece holder 12A. Further, a feedback loop in the electronics can control the rotation speed by adjusting a flow rate in the first alternative injection nozzle 42A.

An alternative rotation speed sensing arrangement of the present invention places the light source 52 and the light sensor 58 within the alternative pressure chamber 40A. Thus, the alternative rotation speed sensing arrangement does not use the first and second sight glasses, 54 and 56.

It will be readily apparent to one skilled in the art that other various modifications may be made to the preferred embodiment without departing from the spirit and scope of the invention as defined by the appended claims.

What is claimed is:

1. An apparatus for agitating a workpiece in a high pressure environment comprising:
   a. a workpiece holder comprising a region for holding the workpiece and protrusions;
   b. a bearing coupled to the workpiece holder;
   c. a pressure chamber housing coupled to the bearing; and
   d. a nozzle coupled to the pressure chamber housing such that in operation a fluid exits the nozzle and impinges the protrusions of the workpiece holder causing the workpiece holder to rotate.

2. The apparatus of claim 1 wherein the workpiece holder comprises a semiconductor substrate holder.

3. The apparatus of claim 1 wherein the protrusions comprise edge protrusions.

4. The apparatus of claim 1 wherein the bearing comprises a spindle bearing.

5. The apparatus of claim 1 wherein the bearing comprises a roller bearing.

6. The apparatus of claim 1 wherein the bearing comprises a ball bearing.

7. The apparatus of claim 1 wherein the bearing comprises a journal bearing.

8. The apparatus of claim 1 further comprising a light source and a sensor such that in operation the light source and the sensor provide a measurement of rotation speed of the workpiece holder.

9. The apparatus of claim 8 further comprising a first sight glass, the first sight glass optically coupling the light source to the workpiece holder.

10. The apparatus of claim 8 further comprising a second sight glass, the second sight glass optically coupling the sensor to the workpiece holder.

11. An apparatus for agitating a workpiece in a high pressure environment comprising:
    a. a semiconductor substrate holder comprising a region for holding the semiconductor substrate and edge protrusions;
    b. a spindle bearing coupled to the workpiece semiconductor substrate holder;
    c. a pressure chamber housing coupled to the spindle bearing; and
    d. a nozzle coupled to the pressure chamber housing such that in operation a fluid exits the nozzle and impinges the edge protrusions of the semiconductor substrate holder causing the semiconductor substrate holder to rotate.

12. A method of agitating a workpiece within a high pressure chamber comprising the steps of:
    a. placing the workpiece on a rotatable workpiece holder; and
    b. impinging fluid on protrusions of the rotatable workpiece holder to rotate the rotatable workpiece holder and agitate the workpiece.

* * * * *